United States Patent
Tsuchiya et al.

(10) Patent No.: US 10,273,383 B2
(45) Date of Patent: Apr. 30, 2019

(54) POLISHING COMPOSITION FOR SILICON WAFER AND POLISHING METHOD

(71) Applicant: FUJIMI INCORPORATED, Kiyosu-shi, Aichi (JP)

(72) Inventors: Kohsuke Tsuchiya, Aichi (JP); Satoshi Momota, Aichi (JP)

(73) Assignee: FUJIMI INCORPORATED, Kiyosu-shi (JP)

( * ) Notice: Subject to any disclaimer, the term of this patent is extended or adjusted under 35 U.S.C. 154(b) by 14 days.

(21) Appl. No.: 15/551,267

(22) PCT Filed: Jan. 22, 2016

(86) PCT No.: PCT/JP2016/000322
§ 371 (c)(1),
(2) Date: Aug. 15, 2017

(87) PCT Pub. No.: WO2016/132676
PCT Pub. Date: Aug. 25, 2016

(65) Prior Publication Data
US 2018/0066161 A1 Mar. 8, 2018

(30) Foreign Application Priority Data

Feb. 19, 2015 (JP) ................................ 2015-030381
Apr. 22, 2015 (JP) ................................ 2015-087602

(51) Int. Cl.
*C09G 1/02* (2006.01)
*B24B 37/00* (2012.01)
(Continued)

(52) U.S. Cl.
CPC ................ *C09G 1/02* (2013.01); *B24B 37/00* (2013.01); *B24B 37/044* (2013.01);
(Continued)

(58) Field of Classification Search
None
See application file for complete search history.

(56) References Cited

U.S. PATENT DOCUMENTS 6,852,009 B2 * 2/2005 Kawase ............ H01L 21/02024
51/309
2003/0154659 A1 8/2003 Xu et al.
(Continued)

FOREIGN PATENT DOCUMENTS

JP 2001-015461 A 1/2001
JP 2005-518668 A 6/2005
(Continued)

*Primary Examiner* — Kaj K Olsen
*Assistant Examiner* — Ross J Christie
(74) *Attorney, Agent, or Firm* — Foley & Lardner LLP (57) ABSTRACT

To perform polishing while reducing an LPD and preventing contamination with metals, particularly nickel and copper, in final polishing of a silicon wafer. A polishing composition contains abrasives, a water-soluble polymer, a basic compound, a chelating agent, and water, in which, when the particle diameter equivalent to a particle diameter at a cumulative volume of 10% from a smaller particle diameter side is defined as D10, the particle diameter equivalent to a particle diameter at a cumulative volume of 50% from the smaller particle diameter side is defined as D50, and the particle diameter equivalent to a particle diameter at a cumulative volume of 90% from the smaller particle diameter side is defined as D90 in a particle size distribution of particles present in the polishing composition, a value of a coarse particle frequency parameter A defined by (Expression 1) illustrated below is less than 1.7, $A=(D90-D50)/(D50-D10)$ and the polishing composition is used for final polishing in silicon wafer polishing.

12 Claims, 1 Drawing Sheet

(51) Int. Cl.
- *H01L 21/304* (2006.01)
- *C09K 3/14* (2006.01)
- *H01L 21/02* (2006.01)
- *B24B 37/04* (2012.01)

(52) U.S. Cl.
CPC ...... *C09K 3/1463* (2013.01); *H01L 21/02024* (2013.01); *H01L 21/304* (2013.01)

(56) References Cited

U.S. PATENT DOCUMENTS

| | | |
|---|---|---|
| 2004/0031206 A1 | 2/2004 | Uchino et al. |
| 2004/0186206 A1* | 9/2004 | Yoneda ............ C08K 3/36 524/95 |
| 2005/0204637 A1* | 9/2005 | Tamai ............ C09G 1/02 51/298 |
| 2006/0151854 A1 | 7/2006 | Kawase et al. |
| 2008/0051010 A1 | 2/2008 | Uemura |
| 2010/0081281 A1* | 4/2010 | Babu ............ C09G 1/02 438/693 |
| 2013/0309946 A1* | 11/2013 | Hamaguchi ........ B24B 37/044 451/59 |
| 2014/0001155 A1* | 1/2014 | Hamaguchi ........ B24B 37/044 216/89 |
| 2014/0302752 A1 | 10/2014 | Tsuchiya et al. |
| 2015/0166838 A1 | 6/2015 | Tsuchiya et al. |
| 2016/0090513 A1* | 3/2016 | Zhang ............ C09G 1/02 216/53 |
| 2016/0319160 A1* | 11/2016 | Prevo ............ C09G 1/18 |

FOREIGN PATENT DOCUMENTS

| | | |
|---|---|---|
| JP | 2008-053415 A | 3/2008 |
| JP | 4912592 B2 | 4/2012 |
| JP | 2014-151424 A | 8/2014 |
| WO | WO-2012/036087 A1 | 3/2012 |
| WO | WO-2013/061771 A1 | 5/2013 |
| WO | WO-2013/108770 A1 | 7/2013 |
| WO | WO-2014/179419 A1 | 11/2014 |

* cited by examiner

POLISHING COMPOSITION FOR SILICON WAFER AND POLISHING METHOD

TECHNICAL FIELD

The present invention relates to a polishing composition for silicon wafer and particularly relates to a polishing composition and a polishing method for use in final polishing of a silicon wafer.

BACKGROUND ART

In a semiconductor device for use in a computer, miniaturization of the wiring width referred to as a design rule has advanced year after year in order to realize a higher integration and an increase in speed. Therefore, a case where substrate surface defects of nanometer scale, which have not been treated as problems heretofore, adversely affect on the performance of the semiconductor device has increased. Therefore, the importance of overcoming the substrate surface defects with nanometer scale has increased.

Among semiconductor substrates, a polishing composition containing silica particles and a water-soluble polymer is preferably used for silicon wafer polishing. When a silicon wafer is polished with a polishing composition disclosed in Patent Document 1, a protective film derived from a water-soluble polymer is formed on the silicon wafer surface after polishing. Since the protective film imparts hydrophilicity to the substrate surface after polishing, it is becoming easy to handle the substrate after polishing. However, the water-soluble polymer for use in the polishing composition has hundreds of thousands or more of molecular weights, and therefore may form an aggregate with the silica particles. The aggregate containing the silica particles and the water-soluble polymer may cause a substrate surface defect referred to as a Light Point Defect (LPD).

In order to reduce the LPD resulting from the aggregate containing the silica particles and the water-soluble polymer, it is important to eliminate the aggregate from the polishing composition. Then, Patent Document 2 has proposed adding a surfactant and the like to a polishing composition to increase the dispersibility of abrasives. Patent Document 3 has proposed compounding an aggregation inhibitor in a polishing composition to thereby provide a polishing composition having high dispersibility of abrasives while imparting high hydrophilicity to the substrate surface after polishing.

Moreover, in final polishing of a silicon wafer, it is important to prevent not only the LPD resulting from an aggregate but contamination with metals and metallic compounds, particularly nickel (Ni) and copper (Cu).

CITATION LIST

Patent Literature

PTL 1: JP 2005-518668 T
PTL 2: JP 2001-15461 A
PTL 3: WO 2013/061771

SUMMARY OF INVENTION

Technical Problem

It is an object of the present invention to perform polishing while reducing an LPD and preventing contamination with metals, particularly nickel and copper, in final polishing of a silicon wafer.

Solution to Problem

In order to achieve the object, the present invention provides, as one embodiment of the present invention, a polishing composition for final polishing of silicon wafer containing abrasives, a water-soluble polymer, a basic compound, a chelating agent, and water, in which, when the particle diameter equivalent to a particle diameter at a cumulative volume of 10% from the smaller particle diameter side is defined as D10, the particle diameter equivalent to a particle diameter at a cumulative volume of 50% from the smaller particle diameter side is defined as D50, and the particle diameter equivalent to a particle diameter at a cumulative volume of 90% from the smaller particle diameter side is defined as D90 in a particle size distribution of particles present in the polishing composition based on the volume-basis particle size of the abrasives measured by a particle size distribution meter employing a dynamic light scattering method, a value of a coarse particle frequency parameter A defined by the following (Expression 1) is less than 1.7, $$A=(D90-D50)/(D50-D10) \qquad \text{(Expression 1)}.$$

In a polishing composition for final polishing of silicon wafer according to another embodiment of the present invention, the weight ratio of the abrasives, the water-soluble polymer, the basic compound, and the chelating agent may be 50 to 95:1 to 20:1 to 30:1 to 10 in the polishing composition described above.

In a polishing composition for final polishing of silicon wafer according to another embodiment of the present invention, the weight average molecular weight of the water-soluble polymer may be 10,000 to 1,000,000 in the polishing composition described above.

In a polishing composition for final polishing of silicon wafer according to another embodiment of the present invention, the chelating agent may contain one or two or more substances selected from ethylenediaminetetrakis (methylenephosphonic acid) (EDTPO), triethylenetetraminehexaacetic acid (TTHA), and diethyltriaminepentaacetic acid (DTPA) in the polishing composition described above.

In a polishing composition for final polishing of silicon wafer according to another embodiment of the present invention, the abrasives may contain colloidal silica produced by a sol-gel method in the polishing composition described above.

Another embodiment of the present invention provides a polishing method including performing final polishing in silicon wafer polishing using the polishing composition described above.

DESCRIPTION OF EMBODIMENTS

Hereinafter, embodiments of the present invention are described.

A polishing composition of this embodiment is prepared by mixing abrasives, a water-soluble polymer, a basic compound, a chelating agent, and water.

(Abrasives)

The abrasives serve to physically polish the substrate surface. Examples of the abrasives include oxide particles, such as silica particles, alumina particles, cerium oxide particles, chromium oxide particles, titanium dioxide particles, zirconium oxide particles, magnesium oxide particles, manganese dioxide particles, zinc oxide particles, and red oxide particles, nitride particles, such as silicon nitride particles and boron nitride particles, carbide particles, such as silicon carbide particles and boron carbide particles; carbonates, such as diamond particles, calcium carbonate, and barium carbonate, and the like.

Among these specific examples, silica is preferable. As specific examples of silica, silica particles selected from colloidal silica, fumed silica, and sol-gel method silica are mentioned. Among the silica particles, it is preferable to use silica particles selected from colloidal silica and fumed silica, particularly colloidal silica, in the viewpoint of reducing the scratch generated in the polished surface of a silicon wafer substrate. The substances mentioned above may be used singly or in combination of two or more kinds thereof.

In general, in the polishing composition containing the water-soluble polymer and the abrasives, the water-soluble polymer is partially adsorbed to the abrasives or an aggregate of the abrasives via the water-soluble polymer is formed in some cases. Therefore, in the polishing composition containing the water-soluble polymer and the abrasives, the average particle diameter of the particles present in the polishing composition tends to be larger than that of a polishing composition not containing a water-soluble polymer. In this specification, the term "particles present in the polishing composition" is used as a term including abrasive raw materials, a water-soluble polymer adsorbent of abrasives not forming an aggregate or an aggregate of abrasives via a water-soluble polymer, and the like as described above.

In the polishing composition of this embodiment, when the particle diameter equivalent to a particle diameter at a cumulative volume of 10% from the smaller particle diameter side is defined as D10, the particle diameter equivalent to a particle diameter at a cumulative volume of 50% from the smaller particle diameter side is defined as D50, and the particle diameter equivalent to a particle diameter at a cumulative volume of 90% from the smaller particle diameter side is defined as D90 in a particle size distribution of the particles present in the polishing composition of this embodiment based on the volume-basis particle size of the particles measured by a particle size distribution meter employing a dynamic light scattering method, a value of a coarse particle frequency parameter A defined by the following (Expression 1) is less than 1.7, $$A=(D90-D50)/(D50-D10) \quad \text{(Expression 1)}.$$

The value of the coarse particle frequency parameter A indicates the dispersion stability of the abrasives in the polishing composition. The value of the coarse particle frequency parameter A is less than 1.7, preferably less than 1.5, and more preferably less than 1.4. With a reduction in the value of the coarse particle frequency parameter A, the dispersion stability of the polishing composition is improved, so that defects decrease. The value of the coarse particle frequency parameter A is 1.0 or more and preferably 1.1 or more in principle. The polishing removal rate of the silicon wafer is improved with an increase in the value of the coarse particle frequency parameter A.

The average particle diameter of the particles present in the polishing composition of this embodiment is preferably 10 nm or more and more preferably 20 nm or more. The polishing removal rate of the silicon wafer is improved by an increase in the average particle diameter of the particles present in the polishing composition. The average particle diameter of the particles present in the polishing composition is preferably 200 nm or less and more preferably 100 nm or less. The storage stability of the polishing composition is improved by a reduction in the average particle diameter of the particles present in the polishing composition. The value of the average particle diameter of the particles is the volume average particle diameter measured by a particle size distribution meter employing a dynamic light scattering method and can be measured using a "UPA-UT151" type manufactured by Nikkiso Co., Ltd., for example.

The average primary particle diameter of the abrasives is preferably 5 nm or more and more preferably 10 nm or more. The polishing removal rate of the silicon wafer is improved by an increase in the average primary particle diameter of the abrasives. The average primary particle diameter of the abrasives is preferably 100 nm or less and more preferably 50 nm or less. The storage stability of the polishing composition is improved by a reduction in the average primary particle diameter of the abrasives. The value of the average primary particle diameter of the abrasives can be calculated based on the specific surface area of the abrasives measured by a BET method. The specific surface area of the abrasives can be measured using a "FlowSorbII 2300" type manufactured by Micromeritics, for example.

The shape (outer shape) of the abrasives may be a spherical shape or may be a non-spherical shape. Examples of the non-spherical shape include a so-called cocoon shape of an oval shape having a constriction in a central portion, a shape having a plurality of projections on the surface, a rugby ball shape, and the like, for example. For example, abrasives having a large number of peanut-shaped abrasives can be preferably used. The abrasives may have a structure in which two or more primary particles are aggregated.

Although not particularly limited, the average major axis/minor axis ratio (average aspect ratio) of the primary particles of the abrasives is 1.0 or more in principle and preferably 1.1 or more and more preferably 1.2 or more. A higher polishing removal rate can be realized by an increase in the average aspect ratio of the abrasives. The average aspect ratio of the abrasives is preferably 4.0 or less, more preferably 3.0 or less, and still more preferably 2.5 or less from the viewpoint of scratch reduction and the like.

The shape (outer shape) and the average aspect ratio of the abrasives can be grasped by electron microscope observation, for example. As a specific procedure of grasping the average aspect ratio, the minimum rectangle circumscribed to each particle image is drawn about a predetermined number (for example, 200 particles) of the abrasive particles, independent particle shape of which can be recognized using a scanning electron microscope (SEM), for example. Then, with respect to the rectangle drawn for each particle image, a value obtained by dividing the length of the long side (major axis value) by the length of the short side (minor axis value) is calculated as the major axis/minor axis ratio (aspect ratio). The average aspect ratio can be determined by calculating the arithmetic mean of the aspect ratios of the predetermined number of particles.

The content of the abrasives in the polishing composition is preferably 0.01 wt. % or more, more preferably 0.03 wt. % or more, and still more preferably 0.05 wt. % or more. When the content of the abrasives is within the ranges mentioned above, the polishing removal rate of the silicon wafer is improved.

The content of the abrasives in the polishing composition is preferably 5 wt. % or less, more preferably 1 wt. % or less, and still more preferably 0.5 wt. % or less. When the content of the abrasives is within the ranges mentioned above, the dispersion stability of the polishing composition is improved and the abrasive residue after polishing decreases, and therefore the LPD decreases.

(Water-Soluble Polymer)

The water-soluble polymer increases the surface wettability of the polished surface of the silicon wafer substrate in surface treatment of the silicon wafer substrate, such as in polishing or in rinse treatment. The polishing composition contains, as the water-soluble polymer, a water-soluble polymer of a solid raw material to be supplied into water in a state of a solid body or a solid state in preparing the polishing composition. The solid raw material means one in a solid body or a solid state when visually observed in an environment of a temperature of 23° C., a relative humidity of 50%, and one atmospheric pressure in a raw material state before being dissolved in water. The water-soluble polymer includes those synthesized from monomers in water or a mixed solvent of water and aqueous organic solvents, such as alcohol and ketone, and includes those in an aqueous liquid form in the solution state or those in an aqueous solution form from which a volatile solvent is distilled off. Hereinafter, the "water-soluble polymer of a solid raw material", the "water-soluble polymer of an aqueous form", and the "water-soluble polymer of an aqueous solution form" are simply referred to as a "water-soluble polymer".

As the water-soluble polymer, those containing at least one functional group selected from a cationic group, an anionic group, and a nonionic group in the molecules are usable and, specifically, all substances are usable which contain a hydroxyl group, a carboxyl group, an acyloxy group, a sulfo group, an amide group, an amidino group, an imino group, an imide group, a quaternary nitrogen structure, a heterocyclic structure containing the functional group units mentioned above, a vinyl structure, a polyoxyalkylene structure, and the like in the molecules. Specific examples thereof include a cellulose derivative, polyvinyl alcohol, poly(meth)acrylic acid, poly(meth)acrylamide alkylsulfonic acid, polyisoprene sulfonic acid, polyvinyl sulfonic acid, polyallyl sulfonic acid, polyisoamylene sulfonic acid, polystyrene sulfonate, poly(meth)acrylamide, polyalkylaminoalkyl(meth)acrylamide, polyvinyl pyrrolidone, a copolymer containing polyvinyl pyrrolidone in a part of the structure, polyvinyl caprolactam, a copolymer containing polyvinyl caprolactam in a part of the structure, polyalkoxyalkyl (meth)acrylamide, polyhydroxyalkyl (meth)acrylamide, poly(meth)acryloyl morpholine, polyamidine, polyethyleneimine, hydrophilized polyimide, various polyamino acids, imine derivatives, such as poly(N-acylalkyleneimine), a polyvinyl alcohol derivative in which a part of the hydroxyl group site of polyvinyl alcohol is substituted by a quaternary nitrogen structure, polymers having polyoxyethylene and polyoxyalkylene structures, polymers having a plurality of kinds of structures, such as a diblock type, a triblock type, a random type, and an alternate type thereof, and the like. The representation of the poly(meth)acrylic acid means acrylic acid and/or methacrylic acid and the same applies to the other compounds.

Among the water-soluble polymers mentioned above, the cellulose derivative, polyvinylalcohol, polyvinyl pyrrolidone, polyacryloyl morpholine, or the polymer having a polyoxyalkylene structure are preferable from the viewpoint of an improvement of surface wettability of the polished surface of the silicon wafer substrate, prevention of adhesion of the particles, reduction in surface roughness, and the like. Specific examples of the cellulose derivative include hydroxyethylcellulose, hydroxypropylcellulose, hydroxyethylmethylcellulose, hydroxypropylmethylcellulose, methylcellulose, ethylcellulose, ethylhydroxyethylcellulose, carboxymethylcellulose, and the like. Among the cellulose derivatives, hydroxyethylcellulose is particularly preferable in terms of the fact that the capability of imparting surface wettability to the polished surface of the silicon wafer substrate is high and hydroxyethylcellulose has good cleaning properties. The water-soluble polymers may be used singly or in combination of two or more kinds thereof.

The weight average molecular weight of the water-soluble polymer in the polishing composition is 10,000 or more in terms of polyethylene oxide. By an increase in the weight average molecular weight of the water-soluble polymer, the surface wettability of the polished surface of the silicon wafer substrate tends to increase.

The weight average molecular weight of the water-soluble polymer in the polishing composition is preferably 2,000,000 or less, more preferably 1,000,000 or less, still more preferably 500,000 or less, and most preferably 300,000 or less. By a reduction in the weight average molecular weight of the water-soluble polymer, the stability of the polishing composition tends to be further maintained. Furthermore, the haze level of the polished surface of the silicon wafer substrate tends to decreases.

The content of the water-soluble polymer in the polishing composition is preferably 0.0001 wt. % or more, more preferably 0.001 wt. % or more, and still more preferably 0.005 wt. % or more. By an increase in the content of the water-soluble polymer in the polishing composition, the surface wettability of the polished surface of the silicon wafer substrate tends to be further improved.

The content of the water-soluble polymer in the polishing composition is preferably 0.5 wt. % or less, more preferably 0.1 wt. % or less, and still more preferably 0.05 wt. % or less. By a reduction in the content of the water-soluble polymer in the polishing composition, the stability of the polishing composition tends to be further maintained.

(Basic Compound)

The polishing composition contains a basic compound. The basic compound imparts a chemical action to the polished surface of the silicon wafer substrate for chemically polishing (chemical etching). Thus, the polishing removal rate in polishing of the silicon wafer substrate can be easily increased.

Specific examples of the basic compound include inorganic basic compounds, hydroxides or salts of alkali metals or alkaline-earth metals, quaternary ammonium hydroxides or salts thereof, ammonia, amine, and the like. Specific examples of the alkali metals include potassium, sodium, and the like. Specific examples of the salts include carbonate, hydrogencarbonate, sulfate, acetate, and the like. Specific examples of the quaternary ammonium include tetramethylammonium, tetraethylammonium, tetrabutylammonium, and the like. Specific examples of the hydroxides or salts of alkali metals include potassium hydroxide, potassium carbonate, potassium hydrogen carbonate, potassium sulfate, potassium acetate, potassium chloride, and the like. Specific examples of the quaternary ammonium hydroxides or salts thereof include tetramethylammonium hydroxide, tetraethylammonium hydroxide, tetrabutylammonium hydroxide, and the like. Specific examples of the amine include methylamine, dimethylamine, trimethylamine, ethylamine, diethylamine, triethylamine, ethylenediamine, monoethanolamine, N-(β-aminoethyl)

ethanolamine, hexamethylenediamine, diethylenetriamine, triethylenetetramine, anhydrous piperazine, piperazine hexahydrate, 1-(2-aminoethyl)piperazine, N-methyl piperazine, guanidine, azoles, such as imidazole and triazole, and the like. These basic compounds may be used singly or in combination of two or more kinds thereof.

Among the basic compounds, at least one kind selected from ammonia, ammonium salt, alkali metal hydroxide, alkali metal salt, and quaternary ammonium hydroxide is preferable. Among the basic compounds, at least one kind selected from ammonia, potassium hydroxide, sodium hydroxide, tetramethylammonium hydroxide, tetraethylammonium hydroxide, ammonium hydrogen carbonate, ammonium carbonate, potassium hydrogen carbonate, potassium carbonate, sodium hydrogen carbonate, and sodium carbonate is more preferable. Among the basic compounds, at least one kind selected from ammonia, potassium hydroxide, sodium hydroxide, tetramethylammonium hydroxide, and tetraethylammonium hydroxide is more preferable, at least either ammonia or tetramethylammonium hydroxide is more preferably, and ammonia is the most preferable.

The content of the basic compound in the polishing composition is preferably 0.0001 wt. % or more, more preferably 0.001 wt. % or more, and still more preferably 0.005 wt. % or more. By an increase in the content of the basic compound in the polishing composition, the dispersion stability of the polishing composition tends to be improved.

The content of the basic compound in the polishing composition is preferably 0.5 wt. % or less, more preferably 0.1 wt. % or less, still more preferably 0.05 wt. % or less, and most preferably 0.01 wt. % or less. By a reduction in the content of the basic compound in the polishing composition, the smoothness of the substrate surface after polishing tends to be improved.

(Chelating Agent)

The polishing composition contains a chelating agent. The chelating agent prevents metal contamination of the silicon wafer substrate by capturing metal impurity components in a polishing system to form a complex.

In general, when the chelating agent is contained in the polishing composition, the dispersion stability of the particles of the composition decreases. Particularly when the water-soluble polymer is contained, the dispersion stability of the particles of the composition is considerably impaired, and therefore the chelating agent is not generally contained. The present inventors have focused on the particle size distribution of the particles present in the polishing composition, and then have found that, even when the chelating agent is used, the dispersion stability of the particles of the composition is not impaired in the case where the value of the coarse particle frequency parameter A satisfies less than 1.7, and therefore defects can be reduced and contamination with metals, such as nickel and copper, of the silicon wafer substrate can be prevented.

Examples of the chelating agent include an aminocarboxylic acid-based chelating agent and an organic phosphonic acid-based chelating agent, for example. Specific examples of the aminocarboxylic acid-based chelating agent include, for example, ethylenediaminetetraacetic acid, sodium ethylenediaminetetraacetate, nitrilotriacetic acid, sodium nitrilotriacetate, ammonium nitrilotriacetate, hydroxyethylethylenediaminetriacetic acid, sodium hydroxyethylethylenediaminetriacetate, diethylenetriaminepentaacetic acid, sodium diethylenetriaminepentaacetate, triethylenetetraminehexaacetic acid, and sodium triethylenetetraminehexaacetate. Specific examples of the organic phosphonic acid-based chelating agent include, for example, 2-aminoethylphosphonic acid, 1-hydroxyethylidene-1,1-diphosphonic acid, amino tri(methylene phosphonic acid), ethylenediamine tetra(methylene phosphonic acid), diethylenetriamine penta(methylene phosphonic acid), ethane-1,1-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methane hydroxy phosphonic acid, 2-phosphonobutane-1,2-dicarboxylic acid, 1-phosphonobutane-2,3,4-tricarboxylic acid, and α-methyl phosphonosuccinic acid. Among these chelating agents, ethylenediaminetetraacetic acid, diethyltriaminepentaacetic acid, triethylenetetraminehexaacetic acid, ethylenediamine tetrakis (methylenephosphonic acid), and diethylenetriamine penta(methylenephosphonic acid) are preferably used and ethylenediamine tetrakis(methylenephosphonic acid) is most preferably used. The chelating agents may be used singly or in combination of two or more kinds thereof.

The content of the chelating agent in the polishing composition is preferably 0.0001 wt. % or more, more preferably 0.001 wt. % or more, and most preferably 0.002 wt. % or more. By an increase in the content of the chelating agent, an effect of preventing metal contamination of the silicon wafer substrate is improved.

The content of the chelating agent in the polishing composition is preferably 1 wt. % or less, more preferably 0.5 wt. % or less, and most preferably 0.1 wt. % or less. By a reduction in the content of the chelating agent, the stability of the polishing composition tends to be further maintained.

(Component Ratio in Polishing Composition)

In the polishing composition described above, the weight ratio of the abrasives, the water-soluble polymer, the basic compound, and the chelating agent may be 50 to 95:1 to 20:1 to 30:1 to 10. By setting the ratio of each component in this range, the dispersion stability of the polishing composition is improved and the cleaning properties of the silicon wafer after cleaning are improved.

(Water)

Water serves as a dispersion medium or a solvent of other components. In order to avoid blocking of the action of the other components contained in the polishing composition as much as possible, the total content of transition metal ions in water is preferably set to 100 ppb or less, for example. The purity of water can be increased by an operation, such as removal of impurity ions using an ion-exchange resin, removal of particles through a filter, or distillation, for example. Specifically, ion exchanged water, pure water, ultrapure water, distilled water, and the like are preferably used.

(pH)

The pH of the polishing composition is preferably 8.0 or more, more preferably 8.5 or more, and still more preferably 9.0 or more. By an increase in the pH of the polishing composition, when the silicon wafer substrate is polished, a high polishing removal rate tends to be obtained. The pH of the polishing composition is preferably 11.0 or less, more preferably 10.8 or less, and still more preferably 10.5 or less. By a reduction in pH of the polishing composition, the roughness of the silicon wafer substrate tends to be able to be reduced.

(Other Additives)

The polishing composition may further contain a surfactant. By adding a surfactant, the roughness of the substrate surface resulting from the chemical etching action of the basic compound can be prevented, so that the surface smoothness is improved.

Examples of the surfactant include anionic or nonionic surfactants. Among the surfactants, a nonionic surfactant is preferably used. Since the foamability of the nonionic surfactant is low, the handling in preparing or in use of the polishing composition is facilitated. Moreover, the pH adjustment is further facilitated than that in a case of using an ionic surfactant, for example.

Specific examples of the nonionic surfactant include homopolymers of oxyalkylene, copolymers of a plurality of kinds of oxyalkylenes, and polyoxyalkylene adducts. Specific examples of the homopolymers of oxyalkylene include polyoxyethylene, polyethylene glycol, polyoxypropylene, and polyoxybutylene. Specific examples of the copolymers of a plurality of kinds of oxyalkylenes include polyoxyethylene polyoxypropylene glycol and polyoxyethylene polyoxybutylene glycol.

Specific examples of the polyoxyalkylene adducts include polyoxyethylene alkyl ether, polyoxyethylene alkyl phenyl ether, polyoxyethylene alkylamine, polyoxyethylene fatty acid ester, polyoxyethylene glycerol ether fatty acid ester, polyoxyethylene sorbitan fatty acid ester, and the like. More specifically, mentioned are a polyoxyethylene polyoxypropylene copolymer, polyoxyethylene glycol, polyoxyethylene propylether, polyoxyethylene butylether, polyoxyethylene pentylether, polyoxyethylene hexylether, polyoxyethylene octylether, polyoxyethylene-2-ethylhexylether, polyoxyethylene nonylether, polyoxyethylene decylether, polyoxyethylene isodecylether, polyoxyethylene tridecylether, polyoxyethylene laurylether, polyoxyethylene cetylether, polyoxyethylene stearylether, polyoxyethylene isostearylether, polyoxyethylene oleylether, polyoxyethylene phenylether, polyoxyethylene octylphenylether, polyoxyethylene nonylphenylether, polyoxyethylene dodecylphenylether, polyoxyethylene styrenated phenylether, polyoxyethylene laurylamine, polyoxyethylene stearylamine, polyoxyethylene oleylamine, polyoxyethylene stearylamide, polyoxyethylene oleylamide, polyoxyethylene monolauric acid ester, polyoxyethylene monostearic acid ester, polyoxyethylene distearic acid ester, polyoxyethylene monooleic acid ester, polyoxyethylene dioleic acid ester, polyoxyethylene sorbitan monolaurate, polyoxyethylene sorbitan monopalmitate, polyoxyethylene sorbitan monostearate, polyoxyethylene sorbitan monooleate, polyoxyethylene sorbitan trioleate, polyoxyethylene sorbitol tetraoleate, polyoxyethylene castor oil, and polyoxyethylene hydrogenated castor oil.

Among these nonionic surfactants, the homopolymer of oxyalkylene or the copolymer of a plurality of kinds of oxyalkylenes is preferably used. In this case, the haze of the polished surface of the silicon wafer substrate after polishing can be easily reduced to a particularly suitable level in practical use. This is considered to be because an ether bond having slight hydrophilicity and an alkylene group having slight hydrophobicity are alternately present in the molecular chains of these polymers.

The ratio of the oxyethylene unit in the homopolymer of oxyalkylene or the copolymer of a plurality of kinds of oxyalkylenes is preferably 85 mass % or more and more preferably 90 mass % or more. By an increase in the ratio of the oxyethylene unit in the polymer, the adhesion of the particles to the polished surface of the silicon wafer substrate after polishing tends to be prevented.

The molecular weight of the surfactant is typically less than 10000 and preferably 9500 or less from the viewpoint of the filterability of the polishing composition, the cleaning properties of a polished article, and the like. The molecular weight of the surfactant is typically 200 or more and preferably 250 or more, more preferably 300 or more, and still more preferably 500 or more from the viewpoint of a haze reduction effect and the like. As the molecular weight of the surfactant, the weight average molecular weight (Mw) (aqueous base, in terms of polyethylene glycol) obtained by GPC or the molecular weight calculated from the chemical formula can be used.

A more preferable range of the molecular weight of the surfactant can also vary depending on the surfactant type. For example, when a block copolymer of polyoxyethylene and polyoxypropylene is used as the surfactant, those having a Mw of 1000 or more are preferable, those having a Mw of 2000 or more are more preferable, and those having a Mw of 5000 or more are still more preferable.

The HLB (hydrophile-lipophile Balance) value of the nonionic surfactant is preferably 8 or more, more preferably 10 or more, and still more preferably 12 or more. By an increase in the HLB value of the nonionic surfactant, the adhesion of the particles to the polished surface of the silicon wafer substrate after polishing tends to be prevented.

The surfactants may be used singly or in combination of two or more kinds thereof. The content of the surfactant in the polishing composition is preferably 0.0001 mass % or more and more preferably 0.001 mass % or more. By an increase in the content of the surfactant, the haze of the surface of a semiconductor substrate after polishing tends to be further reduced. The content of the surfactant in the polishing composition is preferably 0.05 mass % or less and more preferably 0.02 mass % or less. By a reduction in the content of the surfactant, the adhesion of the particles to the polished surface of the silicon wafer substrate after polishing tends to be prevented.

(Other Components)

The polishing composition may further contain known additives generally contained in the polishing composition, e.g., organic acid, organic acid salt, inorganic acid, inorganic acid salt, an antiseptic, an antifungal agent, and the like as necessary. For example, when any one of the organic acid, the organic acid salt, the inorganic acid, and the inorganic acid salt is added, the hydrophilicity of the polished surface of the silicon wafer substrate after polishing can be increased by an interaction with the water-soluble polymer.

Specific examples of the organic acid include fatty acids, such as formic acid, acetic acid, and propionic acid, aromatic carboxylic acids, such as benzoic acid and phthalic acid, citric acid, oxalic acid, tartaric acid, malic acid, maleic acid, fumaric acid, succinic acid, organic sulfonic acid, organic phosphonic acid, and the like. Specific examples of the organic acid salt include alkali metal salts, such as sodium salts and potassium salts, or ammonium salts of the organic acids mentioned as the specific examples of the organic acid.

Specific examples of the inorganic acid include sulfuric acid, nitric acid, hydrochloric acid, carbonic acid, and the like. Specific example of the inorganic acid salt include alkali metal salts, such as sodium salts and potassium salts, or ammonium salts of the inorganic acid mentioned as the specific examples of the inorganic acid.

Among the organic acid salts and the inorganic acid salts, ammonium salts are preferable in terms of preventing metal contamination of the silicon wafer substrate.

The organic acids and salts thereof and the inorganic acids and salts thereof may be used singly or in combination of two or more kinds thereof.

(Polishing Machine and Polishing Method)

Figure 1:
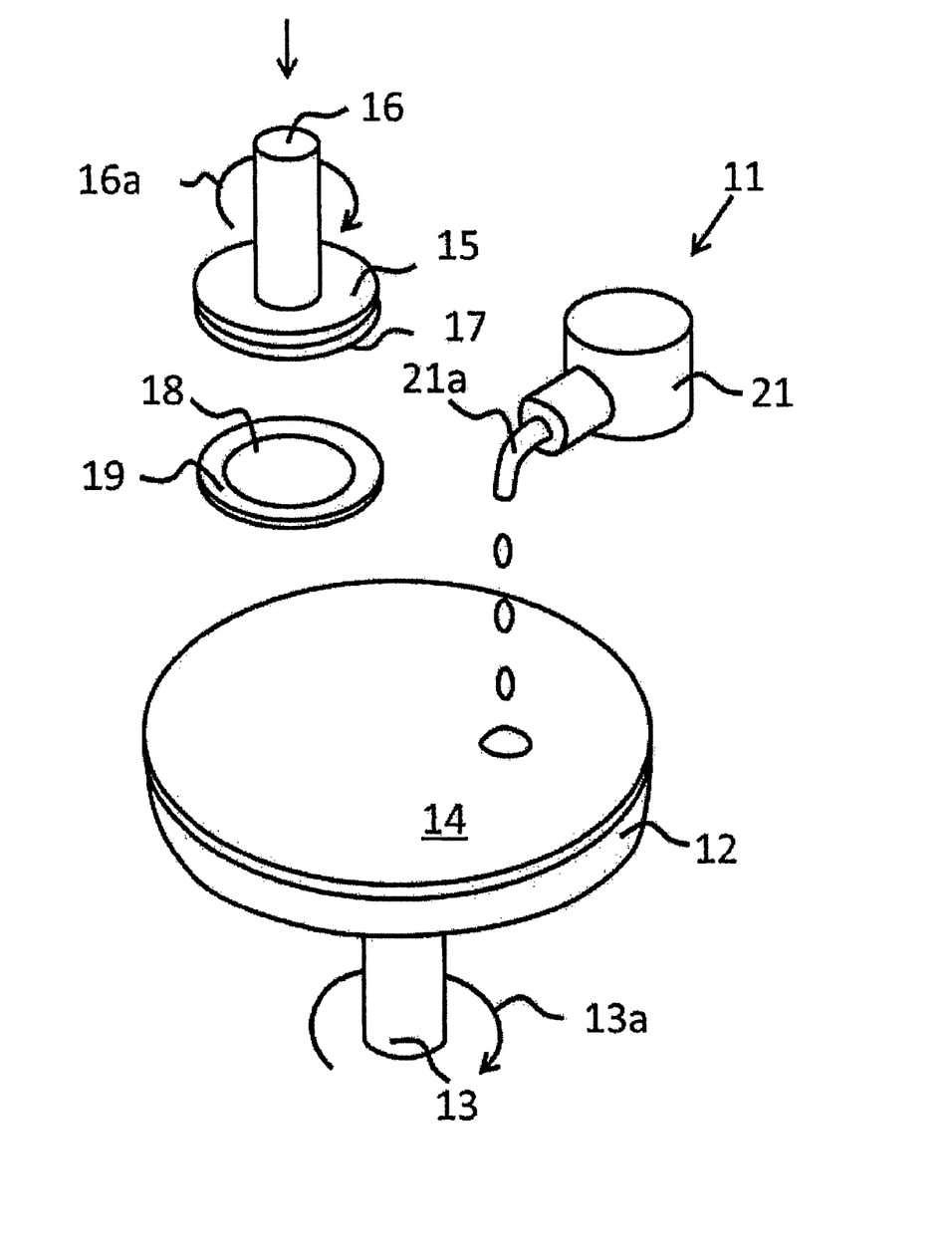
FIG. 1 illustrates a polishing composition supply system for use in a polishing method according to embodiments of the present invention.

Next, a polishing machine is described. FIG. 1 is a perspective view illustrating a single-sided polishing machine according to one embodiment of the present invention.

A polishing machine 11 has a disk-like rotary platen 12 onto the upper surface of which a polishing pad 14 is stuck. The rotary platen 12 is integrally rotatably provided to a first shaft 13 rotating in the direction indicated by an arrow 13a in FIG. 1. At least one wafer holder 15 is provided above the rotary platen 12. The wafer holder 15 is integrally rotatably provided to a second shaft 16 rotating in the direction indicated by an arrow 16a in FIG. 1. A wafer holding plate 19 having a wafer holding hole 18 is removably attached to the bottom surface of the wafer holder 15 through a ceramic plate 17 and an urethane sheet which is not illustrated. The polishing machine 11 further has a polishing composition supply system 21 and a rinsing composition supply system which is not illustrated. The polishing composition supply system 21 discharges the polishing composition through a nozzle 21a. The rinsing composition supply system discharges the rinsing composition through a nozzle which is not illustrated. Either the polishing composition supply system 21 or the rinsing composition supply system is disposed above the rotary platen 12. One supply system disposed above the rotary platen 12 and the other supply system which is not disposed above the rotary platen 12 can be exchanged with each other.

When a silicon wafer is polished, the polishing composition supply system 21 is disposed above the rotary platen 12 as illustrated in FIG. 1. The silicon wafer to be polished is sucked into the wafer holding hole 18 to be held by the wafer holder 15. First, the rotation of the wafer holder 15 and the rotary platen 12 is started, the polishing composition is discharged from the polishing composition supply system 21, and then the polishing composition is supplied onto the polishing pad 14. Then, the wafer holder 15 is moved toward the rotary platen 12 so as to press the silicon wafer against the polishing pad 14. Thus, the surface of the silicon wafer contacting the polishing pad 14 is polished.

Then, the polished silicon wafer can be rinsed. When the polished silicon wafer is rinsed, the rinsing composition supply system, in place of the polishing composition supply system 21, is disposed above the rotary platen 12. The operation conditions of the polishing machine 11 are switched from the setting for polishing to the setting for rinsing, and then the rinsing composition is discharged from the rinsing composition supply system, so that the rinsing composition is supplied onto the polishing pad 14. Thus, the surface of the silicon wafer contacting the polishing pad 14 is rinsed.

The polishing of the silicon wafer surface is preferably performed by dividing the polishing process into multi steps. For example, the silicon wafer surface may be polished in three steps of a first step of rough polishing, a second step of fine polishing, and a third step of final polishing. The polishing composition of the present invention is used in the final polishing when performing polishing in two or more steps.

Examples

Next, the present invention is more specifically described with reference to Examples and Comparative Examples.

(PID Defect Evaluation Test)

The PID (defect) was evaluated by polishing a silicon wafer 300 mm in diameter using polishing compositions containing abrasives, a water-soluble polymer (Hydroxyethylcellulose: HEC, Polyvinyl pyrrolidone: PVP, Polyacryloyl morpholine: PACMO), a chelating agent, and a basic compound of the types and contents illustrated in Table 1, and then cleaning the same under the following conditions. As the abrasives, colloidal silica having a volume average particle diameter measured using a "UPA-UT151" type manufactured by Nikkiso Co., Ltd. of 46 nm was used.

TABLE 1

| | Water-soluble polymer | | Chelating agent | | Basic compound | | Abrasives | Composition particle diameter | | | Parameter A (D90-D50)/(D50-D10) | PID | Cu amount | Ni amount |
|---|---|---|---|---|---|---|---|---|---|---|---|---|---|---|
| | Type | Weight average molecular weight | Concentration [wt. %] | Type | Concentration [wt. %] | Type | Concentration [wt. %] | Concentration [wt. %] | D10 [nm] | D50 [nm] | D90 [nm] | | | | |
| Ex. 1 | HEC | 250000 | 0.004 | EDTPO | 0.0025 | Ammonia | 0.006 | 0.09 | 30 | 49 | 74 | 1.32 | A | A | A |
| | PVP | 45000 | 0.003 | | | | | | | | | | | | |
| Ex. 2 | HEC | 250000 | 0.004 | EDTPO | 0.0013 | Ammonia | 0.006 | 0.09 | 29 | 47 | 72 | 1.39 | A | A | B |
| | PVP | 45000 | 0.003 | | | | | | | | | | | | |
| Ex. 3 | HEC | 250000 | 0.004 | DTPA | 0.0025 | Ammonia | 0.006 | 0.09 | 30 | 49 | 75 | 1.37 | A | A | B |
| | PVP | 45000 | 0.003 | | | | | | | | | | | | |
| Ex. 4 | HEC | 250000 | 0.004 | TTHA | 0.0025 | Ammonia | 0.006 | 0.09 | 30 | 48 | 74 | 1.44 | A | A | B |
| | PVP | 45000 | 0.003 | | | | | | | | | | | | |
| Ex. 5 | HEC | 250000 | 0.004 | TTHA | 0.0025 | Ammonia | 0.012 | 0.09 | 28 | 47 | 72 | 1.32 | A | A | B |
| | PVP | 45000 | 0.001 | | | | | | | | | | | | |
| Ex. 6 | HEC | 250000 | 0.004 | EDTA | 0.0025 | Ammonia | 0.012 | 0.09 | 28 | 47 | 72 | 1.32 | A | B | C |
| | PVP | 45000 | 0.001 | | | | | | | | | | | | |
| Ex. 7 | PACMO | 550000 | 0.004 | EDTPO | 0.0025 | Ammonia | 0.006 | 0.09 | 34 | 49 | 70 | 1.40 | S | A | A |
| | PVA | 13000 | 0.004 | | | | | | | | | | | | |
| Ex. 8 | PACMO | 550000 | 0.004 | TTHA | 0.0025 | Ammonia | 0.006 | 0.09 | 34 | 49 | 70 | 1.40 | S | S | B |
| | PVA | 13000 | 0.004 | | | | | | | | | | | | |
| Ex. 9 | PACMO | 350000 | 0.004 | EDTPO | 0.0025 | Ammonia | 0.011 | 0.18 | 30 | 46 | 68 | 1.38 | S | A | A |
| | PVA | 106000 | 0.005 | | | | | | | | | | | | |
| Ex. 10 | PACMO | 150000 | 0.008 | DTPA | 0.0025 | Ammonia | 0.010 | 0.46 | 41 | 58 | 83 | 1.47 | S | S | B |
| | PVA | 13000 | 0.008 | | | | | | | | | | | | |
| Ex. 11 | PACMO | 150000 | 0.008 | DTPA | 0.025 | Ammonia | 0.010 | 0.46 | 43 | 62 | 90 | 1.47 | S | S | B |
| | PVA | 13000 | 0.008 | | | | | | | | | | | | |

TABLE 1-continued

| | | Water-soluble polymer | | Chelating agent | | Basic compound | | Abrasives | Composition particle diameter | | | Parameter | | | |
| | | Weight | | | | | | | | | | | | | |
| | Type | average molecular weight | Concentration [wt. %] | Type | Concentration [wt. %] | Type | Concentration [wt. %] | Concentration [wt. %] | D10 [nm] | D50 [nm] | D90 [nm] | A (D90-D50)/ (D50-D10) | PID | Cu amount | Ni amount |
|---|---|---|---|---|---|---|---|---|---|---|---|---|---|---|---|
| Ex. 12 | PACMO | 150000 | 0.008 | EDTPO | 0.0025 | Ammonia | 0.010 | 0.46 | 41 | 59 | 85 | 1.44 | S | A | A |
| | PVA | 13000 | 0.008 | | | | | | | | | | | | |
| Ex. 13 | PACMO | 150000 | 0.008 | EDTA | 0.0025 | Ammonia | 0.010 | 0.46 | 41 | 59 | 85 | 1.44 | S | B | C |
| | PVA | 13000 | 0.008 | | | | | | | | | | | | |
| Comp. Ex. 1 | HEC | 250000 | 0.009 | EDTPO | 0.0025 | Ammonia | 0.006 | 0.09 | 33 | 53 | 90 | 1.85 | D | A | A |
| Comp. Ex. 2 | HEC | 250000 | 0.004 | — | — | Ammonia | 0.006 | 0.09 | 29 | 48 | 72 | 1.26 | A | D | D |
| | PVP | 45000 | 0.003 | | | | | | | | | | | | |
| Comp. Ex. 3 | HEC | 250000 | 0.004 | EDTPO | 1 | Ammonia | 0.006 | 0.09 | 36 | 61 | 118 | 2.28 | D | A | A |
| | PVP | 45000 | 0.003 | | | | | | | | | | | | |
| Comp. Ex. 4 | HEC | 250000 | 0.004 | EDTPO | 0.0025 | Ammonia | 0.006 | 0.09 | 32 | 53 | 88 | 1.67 | D | A | A |
| | PVP | 45000 | 0.0001 | | | | | | | | | | | | |
| Comp. Ex. 5 | PACMO | 150000 | 0.008 | — | — | Ammonia | 0.010 | 0.46 | 40 | 57 | 80 | 1.35 | S | C | D |
| | PVA | 13000 | 0.008 | | | | | | | | | | | | |

As a polishing machine, a single wafer polishing machine, "PNX-332B" type manufactured by Okamoto Machine Tool Works, Ltd., was used and the load was set to 15 kPa. The number of rotations of a platen was set to 30 rpm, the number of rotations of a head was set to 30 rpm, the composition feeding rate was set to 2.0 Liter/m (used by continuous flowing), and the temperature of the polishing composition was set to 20° C. Then, polishing was performed for 120 seconds.

The silicon wafer after polishing was cleaned using a cleaning liquid of $NH_4OH(29\%):H_2O_2$ (31%):Deionized water (DIW)=1:3:30 (Volume ratio) (SC-1 cleaning). Herein, two cleaning bathes having an ultrasonic oscillator with a frequency of 950 kHz were prepared, and then the cleaning liquid was stored and held at 60° C. in each of the first and second cleaning bathes. Then, in the state where the ultrasonic oscillator was operated, the silicon wafer after surface treatment was immersed in the first cleaning bath for 6 minutes, and then immersed in the second cleaning bath for 6 minutes through a rinsing bath with ultrapure water and ultrasonic waves.

Polishing and cleaning were performed under the above-described conditions, and then the examination was performed based on the total number of defects measured with a wafer defect tester (MAGICS M5350, manufactured by Lasertec). The results are illustrated in Table 1.

In Table 1, the case where the number of PIDs was less than 150 was indicated as S, the case where the number of PIDs was 150 or more and less than 250 was indicated as A, the case where the number of PIDs was 250 or more and less than 300 was indicated as B, the case where the number of PIDs was 300 or more and less than 350 was indicated as C, and the case where the number of PIDs was 350 or more was indicated as D. In Table 1, the composition particle diameter represents a value measured by a dynamic light scattering method using a UPA-UT151 manufactured by Nikkiso Co., Ltd., and an abrasive raw material, a water-soluble polymer adsorbent of the abrasives not forming an aggregate, or an aggregate of the abrasives via the water-soluble polymer is all included.

As illustrated in Table 1, in Examples 1 to 13 in which the parameter A represented by (Expression 1) was less than 1.7 and which contained a chelating agent, the number of PIDs was less than 350. On the other hand, in Comparative Examples 1, 3, and 4 in which the parameter A was 1.7 or more, the number of PIDs was 350 or more and, in Comparative Example 2 not containing a chelating agent, the number of PIDs was less than 350. In Comparative Example 5 not containing a chelating agent, the number of PIDs was less than 150 but the contamination amount with metals of Cu and Ni was large as described later.

(Metal Contamination Evaluation Test)

Next, metal contamination was evaluated by polishing a silicon wafer 150 mm in diameter using polishing compositions which were forcibly contaminated by further adding 0.005 wt. % of Ni and 0.005 wt. % of Cu to polishing compositions containing abrasives, a water-soluble polymer, a chelating agent, and a basic compound of the same types and contents as those used in the PID defective evaluation test illustrated in Table 1, and then cleaning the same under the following conditions.

As a polishing machine, a batch polishing machine, "SPM-15" type manufactured by FUJIKOSHI MACHINERY CORP., was used and the load was set to 31.5 kPa. The number of rotations of a platen was set to 30 rpm, the number of rotations of a wafer holder was set to 120 rpm, the composition feeding rate was set to 8.0 Liter/m (one-way), and the temperature of the polishing composition was set to 23° C., and then polishing was performed for 900 seconds.

(Cleaning Conditions)

The silicon wafer after polishing was cleaned using a cleaning liquid of $HCl (36\%):H_2O_2$ (31%):deionized water (DIW)=1:1:6 (Volume ratio) (SC-2 cleaning). Herein, one cleaning bath having an ultrasonic oscillator with a frequency of 950 kHz was prepared, and then the cleaning liquid was stored and held at 80° C. in the cleaning bath. Then, the silicon wafer after surface treatment was immersed in the cleaning bath for 6 minutes in the state where the ultrasonic oscillator was operated, and then cleaned with ultrapure water and ultrasonic waves.

(Evaluation Method)

The silicon wafer was polished and cleaned under the above-described conditions, and then heat treated at 200° C. for 48 hours, so that metal impurities in the silicon wafer were moved up to the silicon wafer surface. A natural oxide film on the silicon wafer surface was subjected to vapor phase decomposition with hydrofluoric acid vapor, and then collected with liquid droplets containing hydrofluoric acid and a hydrogen peroxide solution. Then, metal impurities in the collected liquid were quantitatively analyzed by inductively coupled plasma mass spectrometry (ICP-MS). The results were illustrated in Table 1.

In Table 1, the case where the Cu amount was $1\times10^9$ atoms/cm$^2$ or less was indicated by S, the case where the Cu amount was $1\times10^9$ atoms/cm$^2$ or more and less than $3\times10^9$ atoms/cm$^2$ was indicated by A, the case where the Cu amount was $3\times10^9$ atoms/cm$^2$ or more and less than $10\times10^9$ atoms/cm$^2$ was indicated by B, the case where the Cu amount was $10\times10^9$ atoms/cm$^2$ or more and less than $15\times10^9$ atoms/cm$^2$ was indicated by C, and the case where the Cu amount was $15\times10^9$ atoms/cm$^2$ or more was indicated by D.

In Table 1, the case where the Ni amount was less than $1\times10^9$ atoms/cm$^2$ was indicated by A, the case where the Ni amount was $1\times10^9$ atoms/cm$^2$ or more and less than $3\times10^9$ atoms/cm$^2$ was indicated by B, the case where the Ni amount was $3\times10^9$ atoms/cm$^2$ or more and less than $10\times10^9$ atoms/cm$^2$ was indicated by C, and the case where the Ni amount was $10\times10^9$ atoms/cm$^2$ or more was indicated by D.

As illustrated in Table 1, in Examples 1 to 13 in which the parameter A represented by (Expression 1) was less than 1.7 and which contained a chelating agent, the Cu amount was less than $10\times10^9$ atoms/cm$^2$ and the Ni amount was less than $10\times10^9$ atoms/cm$^2$. On the other hand, in Comparative Examples 1, 3, and 4 in which the parameter A was 1.7 or more, the Cu amount was less than $10\times10^9$ atoms/cm$^2$ and the Ni amount was less than $10\times10^9$ atoms/cm$^2$ but, in Comparative Example 2 not containing a chelating agent, the Cu amount was $15\times10^9$ atoms/cm$^2$ or more and the Ni amount was $10\times10^9$ atoms/cm$^2$ or more, and, in Comparative Example 5, the Cu amount was $10\times10^9$ atoms/cm$^2$ or more and the Ni amount was $10\times10^9$ atoms/cm$^2$ or more.

As is clear from Table 1, in Examples 1 to 13, the evaluations of the PID defect and the metal contamination did not contain D, but, in Comparative Examples 1 to 5, either one of the evaluations of the PID defect and the metal contamination contained D. As described above, it was found that, by the use of the polishing composition in which the parameter A represented by (Expression 1) is less than 1.7 and which contains a chelating agent in Examples, both the PID defect and the metal contamination were able to be reduced.

The invention claimed is:

1. A polishing composition comprising:
   abrasives;
   a water-soluble polymer;
   a basic compound;
   a chelating agent; and
   water,
   wherein, when a particle diameter equivalent to a particle diameter at a cumulative volume of 10% from a smaller particle diameter side is defined as D10, a particle diameter equivalent to a particle diameter at a cumulative volume of 50% from the smaller particle diameter side is defined as D50, and a particle diameter equivalent to a particle diameter at a cumulative volume of 90% from the smaller particle diameter side is defined as D90 in a particle size distribution of particles present in the polishing composition, a value of a coarse particle frequency parameter A defined by (Expression 1) illustrated below is 1.1 or more and less than 1.7, $A=(D90-D50)/(D50-D10)$ (Expression 1), and the polishing composition is used for final polishing in silicon wafer polishing,
   wherein a weight ratio of the abrasives, the water-soluble polymer, the basic compound, and the chelating agent is 50 to 95:1 to 20:1 to 30:1 to 10.

2. The polishing composition according to claim 1, wherein a weight average molecular weight of the water-soluble polymer is 10,000 to 1,000,000.

3. The polishing composition according to claim 1, wherein the chelating agent contains one or two or more substances selected from ethylenediaminetetrakis (methylenephosphonic acid) (EDTPO), triethylenetetraminehexaacetic acid (TTHA), and diethyltriaminepentaacetic acid (DTPA).

4. The polishing composition according to claim 1, wherein the abrasives contain colloidal silica produced by a sol-gel method.

5. A polishing method comprising:
   performing final polishing in silicon wafer polishing using the polishing composition according to claim 1.

6. The polishing composition according to claim 1, wherein a weight average molecular weight of the water-soluble polymer is 10,000 to 1,000,000.

7. The polishing composition according to claim 2, wherein the chelating agent contains one or two or more substances selected from ethylenediaminetetrakis (methylenephosphonic acid) (EDTPO), triethylenetetraminehexaacetic acid (TTHA), and diethyltriaminepentaacetic acid (DTPA).

8. The polishing composition according to claim 2, wherein the abrasives contain colloidal silica produced by a sol-gel method.

9. The polishing composition according to claim 3, wherein the abrasives contain colloidal silica produced by a sol-gel method.

10. A polishing method comprising:
    performing final polishing in silicon wafer polishing using the polishing composition according to claim 2.

11. A polishing method comprising:
    performing final polishing in silicon wafer polishing using the polishing composition according to claim 3.

12. A polishing method comprising:
    performing final polishing in silicon wafer polishing using the polishing composition according to claim 4.

* * * * *